United States Patent
Fang et al.

(10) Patent No.: US 10,225,949 B2
(45) Date of Patent: Mar. 5, 2019

(54) METHOD AND SYSTEM FOR CONTROLLING FAN ROTATING SPEED OF LED LAMP, AND LED LAMP THEREOF

(71) Applicant: GE Lighting Solutions, LLC, East Cleveland, OH (US)

(72) Inventors: Min Fang, Shanghai (CN); Qi Long, Shanghai (CN); Liang Shan, Shanghai (CN); Shuyi Qin, Shanghai (CN); Yong Li, Shanghai (CN)

(73) Assignee: GE Lighting Solutions, LLC, East Cleveland, OH (US)

( * ) Notice: Subject to any disclaimer, the term of this patent is extended or adjusted under 35 U.S.C. 154(b) by 0 days.

(21) Appl. No.: 15/833,568

(22) Filed: Dec. 6, 2017

(65) Prior Publication Data

US 2018/0160564 A1    Jun. 7, 2018

(30) Foreign Application Priority Data

Dec. 6, 2016    (CN) .......................... 2016 1 1108588

(51) Int. Cl.
*H05K 7/20*    (2006.01)
*F04D 27/00*    (2006.01)
(Continued)

(52) U.S. Cl.
CPC ....... *H05K 7/20209* (2013.01); *F04D 27/004* (2013.01); *F04D 27/008* (2013.01);
(Continued)

(58) Field of Classification Search
CPC . G06F 1/181–1/182; H05K 7/20218–7/20381;
(Continued)

(56) References Cited

U.S. PATENT DOCUMENTS 8,237,377 B2    8/2012    Hopper
2008/0303466 A1*  12/2008  Eto .......................... H02P 29/50
                                                                  318/443
(Continued)

FOREIGN PATENT DOCUMENTS

CA    2 552 683 A1    6/2005
CN    100557303 C    11/2009
(Continued)

OTHER PUBLICATIONS

Keppens, A. et al., "High power light-emitting diode junction temperature determination from current-voltage characteristics," Journal of Applied Physics, vol. 104, Issue 9, pp. 093104-1-093104-8 (2008).

(Continued)

*Primary Examiner* — Anthony M Haughton
*Assistant Examiner* — Razmeen Gafur
(74) *Attorney, Agent, or Firm* — Peter T. DiMauro; Global Patent Operation

(57) ABSTRACT

A method for controlling the rotational speed of a fan of an LED lamp, comprising: presetting a corresponding relationship between a voltage, a current and a temperature for an LED chip in the LED lamp in the controller, as well as presetting a corresponding relationship between the temperature of LED chip and the speed of the fan in the controller, measuring the voltage and current of the LED chip, obtaining the current calculated temperature of the LED chip through the measured voltage and current, and further determining the current desired fan speed through the obtained current calculated temperature, using the controller to control the fan to rotate at the current desired speed, thereby cooling the LED chip. Additionally a corresponding system for controlling the rotational speed of the fan of an LED lamp and an LED lamp including the system.

11 Claims, 4 Drawing Sheets

(51) Int. Cl.
  *F21V 19/00* (2006.01)
  *F21V 29/61* (2015.01)
  *F21V 29/70* (2015.01)
  *F21V 17/10* (2006.01)
  *F21V 17/12* (2006.01)
  *F21Y 115/10* (2016.01)

(52) U.S. Cl.
  CPC .......... *F21V 19/0015* (2013.01); *F21V 29/61* (2015.01); *F21V 29/70* (2015.01); *H05K 7/20136* (2013.01); *F21V 17/101* (2013.01); *F21V 17/12* (2013.01); *F21Y 2115/10* (2016.08)

(58) Field of Classification Search
  CPC ............. H05K 7/20409–7/20418; H05K 7/20009–7/202; H05K 5/00–5/069; H05K 7/00–7/186; H01L 23/367–23/3677; H01L 23/473; H01L 23/46–23/467
  USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
  See application file for complete search history.

(56) References Cited

U.S. PATENT DOCUMENTS

| | | | | |
|---|---|---|---|---|
| 2008/0304303 A1* | 12/2008 | Hsieh | .................. | H05K 7/20209 363/141 |
| 2009/0153076 A1* | 6/2009 | Huang | .............. | H05B 33/0803 315/294 |
| 2009/0155045 A1* | 6/2009 | Chang | ...................... | F01P 7/04 415/17 |
| 2009/0282174 A1* | 11/2009 | Wu | ...................... | G06F 11/328 710/19 |
| 2010/0277077 A1* | 11/2010 | Pong | ................. | H05B 33/0818 315/152 |
| 2010/0281897 A1* | 11/2010 | Ikeda | ...................... | H02P 6/28 62/186 |
| 2010/0289410 A1* | 11/2010 | Wu | ................... | H05B 33/0854 315/112 |
| 2010/0296285 A1* | 11/2010 | Chemel | ................... | F21S 2/005 362/235 |
| 2011/0121983 A1* | 5/2011 | Chen | ...................... | F04D 29/582 340/635 |
| 2012/0065808 A1* | 3/2012 | Liu | ........................ | G05D 23/20 700/300 |
| 2012/0280620 A1 | 11/2012 | Jackson et al. | | |
| 2013/0200707 A1 | 8/2013 | Hartmann et al. | | |
| 2014/0084836 A1* | 3/2014 | Pham | ................... | G01R 31/343 318/490 |
| 2014/0139165 A1* | 5/2014 | Chen | ................. | G05D 23/1919 318/471 |
| 2014/0145663 A1* | 5/2014 | Kitora | ............... | H05K 7/20209 318/471 |
| 2014/0186156 A1* | 7/2014 | Lai | ........................ | F04D 27/004 415/30 |
| 2014/0247038 A1* | 9/2014 | Wu | ........................ | G01P 3/489 324/166 |
| 2014/0294583 A1* | 10/2014 | Yu | ........................ | F04D 27/004 416/1 |
| 2015/0050121 A1* | 2/2015 | Wu | ........................ | F04D 27/004 415/1 |
| 2015/0067406 A1* | 3/2015 | Wang | ...................... | G06F 11/24 714/40 |
| 2015/0105910 A1* | 4/2015 | Zou | ................... | H05K 7/20836 700/275 |
| 2016/0044830 A1* | 2/2016 | Chang | ................... | G05B 15/02 700/282 |
| 2016/0202129 A1* | 7/2016 | Chang | ................... | G01K 13/00 374/142 |
| 2016/0334091 A1* | 11/2016 | Kim | ...................... | F21V 29/61 |
| 2017/0186183 A1* | 6/2017 | Armstrong | .............. | G01C 3/08 |
| 2017/0264690 A1* | 9/2017 | Hirth | ....................... | G01J 1/44 |

FOREIGN PATENT DOCUMENTS

| | | |
|---|---|---|
| CN | 201396607 Y | 2/2010 |
| CN | 201628116 U | 11/2010 |
| CN | 202587492 U | 12/2012 |

OTHER PUBLICATIONS

Extended European Search Report and Opinion issued in connection with corresponding EP Application No. 17204994.2 dated Apr. 19, 2018.

* cited by examiner

METHOD AND SYSTEM FOR CONTROLLING FAN ROTATING SPEED OF LED LAMP, AND LED LAMP THEREOF

TECHNICAL FIELD

The present invention relates generally to a lighting system, and more particularly to a light emitting diode (LED) lighting system.

BACKGROUND ART

LED, as a new type of lighting source, with its long service life, high light efficiency, rich color temperature, one-time light distribution directional lighting, as well as its ability to work under a safe voltage among other advantages, has become the development trend of lighting.

LED can have the light efficiency 60-70% higher than the that of incandescent light, but it also produces a lot of heat, causing too high temperature, which will lead to a reduction in LED light conversion efficiency, reduced service life of the LED, reduced light output and other consequences.

The existing LED cooling methods mainly include temporarily reducing the power and installing a cooling fan.

If the method of LED power reduction is used, the lighting effect of the LED lamps will be affected; therefore mainstream designs often use the cooling fan option. However, when the cooling fans are used, they often need to rotate at full speed for a long period of time, which leads to noise, reduced service life and other issues.

Therefore, a need exists for a new method to solve this problem.

SUMMARY OF THE INVENTION

One aspect of the present invention is to provide a method of controlling the rotational speed of an LED lamp, the method comprising:

Presetting a corresponding relationship between a voltage, a current and a temperature of an LED chip in an LED lamp in the controller;

Presetting a corresponding relationship between a temperature and a fan speed of the LED chip in the controller;

Measuring the voltage of the LED chip;

Measuring the current of the LED chip;

Determining the current calculated temperature of the LED chip through the controller based on the measured voltage, measured current and the preset corresponding relationship between the voltage, current and temperature of the LED chip;

Determining the current desired fan speed through the controller based on the current calculated temperature and the preset corresponding relationship between the temperature and fan speed of the LED chip; and Controlling the fan to rotate at the current desired fan speed through the controller.

The other aspect of the present invention is to provide a system for controlling the rotational speed of a fan for cooling an LED chip in an LED lamp, comprising;

A voltage measuring unit for measuring the voltage of an LED chip in an LED lamp;

A current measuring unit for measuring the current of the LED chip; and

A controller connected to the voltage measuring unit and the current measuring unit for controlling the rotational speed of the fan, wherein:

The controller has a preset corresponding relationship between the voltage, current and temperature of the LED chip, as well as the corresponding relationship between the temperature and fan speed of the LED chip, and The controller is configured to determine the current calculated temperature of the LED chip based on the voltage measured by the voltage measuring unit, the current measured by the current measuring unit and the preset corresponding relationship between the voltage, current and temperature of the LED chip; determine the current desired fan speed based on the corresponding relationship between the current calculated temperature and the corresponding relationship between the temperature of the LED chip and the fan speed; as well as control the fan to rotate at the current desired fan speed.

Another aspect of the present invention is to provide an LED lamp, comprising: An LED chip; A fan for cooling the LED chip; A system for controlling the rotational speed of the fan, the system comprising: A voltage measuring unit for measuring the voltage of the LED chip; A current measuring unit for measuring the current of the LED chip; and A controller connected to the voltage measuring unit and the current measuring unit for controlling the rotational speed of the fan, wherein:

The controller has a preset corresponding relationship between the voltage, current and temperature of the LED chip, as well as the corresponding relationship between the temperature and fan speed of the LED chip, and The controller is configured to determine the current calculated temperature of the LED chip based on the voltage measured by the voltage measuring unit, the current measured by the current measuring unit and the preset corresponding relationship between the voltage, current and temperature of the LED chip; determine the current desired fan speed based on the corresponding relationship between the current calculated temperature and the corresponding relationship between the temperature of the LED chip and the fan speed; as well as control the fan to rotate at the current desired fan speed.

Compared to the prior art, an embodiment of the method and system for controlling the fan speed of an LED lamp provide a comprehensive and precise control of the fan speed, reduce the noise generated due to the fan's unnecessary full-speed operation, extend the service life of the fan, thereby extending the service life of the LED light. At the same time, the method and system for controlling the fan speed of an LED lamp of the present 9 require no additional sensor and other components but the service life of an LED lamp is extended without no additional cost incurred.

BRIEF DESCRIPTION OF THE DRAWINGS

The present invention will be better understood from the following descriptions of embodiments of the present invention taken in conjunction with the accompanying drawings, in which.

DETAILED DESCRIPTION

Figure 1:
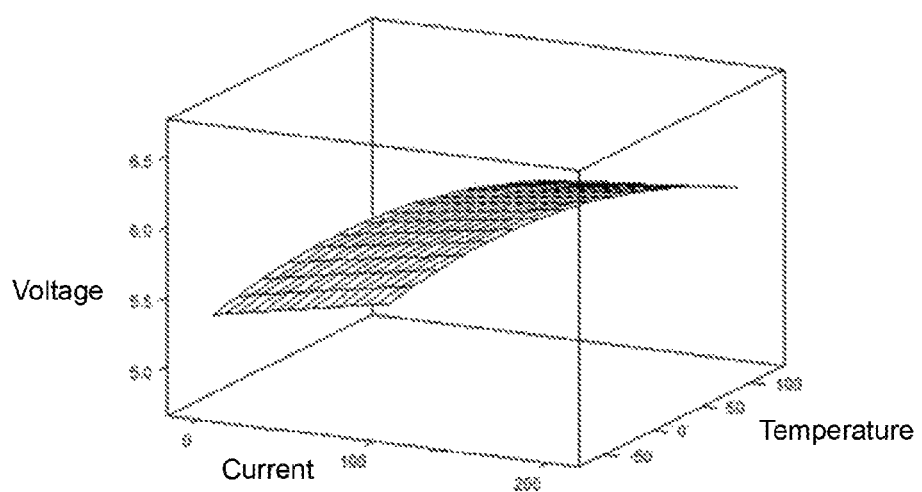
FIG. 1 is a schematic diagram of the corresponding relationship between the voltage, current and temperature of an LED chip.

Unless otherwise defined, terms of art or science used in the claims and the specification are as they are usually understood by those skilled in the art to which the present invention pertains. "First", "second" and similar words used in this specification and in the claims do not denote any order, quantity or importance, but are merely intended to distinguish between different constituents. The terms "one", "a" and the like are not meant to be limiting, but rather denote the presence of at least one. The approximate language used for the present invention can be used for quantitative representation, indicating that there is a certain amount of change that can be allowed without changing the basic functionality. Thus, the numerical values of the present invention corrected by language such as "approximately", "about" are not limited to the exact value itself. In addition, in the expression "from approximately the first value to the second value", "approximately" corrects both the first value and the second value at the same time. In some cases, the approximate language may be related to the accuracy of the measuring instruments. The values mentioned in the present invention include all units added from the lower value to the upper value, where it is assumed that any lower and upper values are separated by at least two units.

All of the values from the lowest value to the highest value listed in this article refer to all units obtained in units of increments between the lowest and highest values when the difference between the lowest and maximum values is more than two units Value. For example, for the number of components such as temperature, pressure, time, and the like, and the value of the process, etc., when we say 1 to 90, they refer to, for example, 15 to 85, 22 to 68, 43 to 51, 30 to 32 and similar enumeration values. When the value is less than 1, a unit can be 0.0001, 0.001, 0.01 or 0.1. This is only a special example for illustration. The numbers listed in this context refer to all possible combinations of values between the maximum and minimum values obtained in a similar manner.

Hereinafter, embodiments of the present invention will be described, and it is to be understood that all of the features of the actual embodiments will not be described in detail in order to provide a concise description in the detailed descriptions of these embodiments. It should be appreciated that, during the implementation of any one of the embodiments, just as during the process of any one construction project or design project, in order to achieve the specific objective of a developer, to meet system-related or business-related limitations, a variety of specific decisions are often made, which will also change from one implementation to another. In addition, it is to be understood that, while the efforts made in this development process may be complex and lengthy, to those of ordinary skill in the art in connection with the present invention, some of the design, manufacturing or production changes made on the bases o the technical contents disclosed in the present invention are only conventional technical means and should not be construed as an inadequate disclosure of the present invention.

An embodiment of the present invention relates to a method of controlling the rotational speed of an LED lamp, comprising: presetting a corresponding relationship between the voltage, current and temperature for a LED chip in an LED lamp, as well as a corresponding relationship between the temperature of the LED chip and the fan speed, in the controller; measuring the voltage and current of the LED chip; determining the current calculated temperature of the LED chip based on the measured voltage and measured current, as well as the preset corresponding relationship between the voltage, current and temperature; determining the current desired fan speed based on the corresponding relationship between the current calculated temperature and the preset corresponding relationship between the temperature and the fan speed; as well as controlling the fan to rotate at the current desired fan speed.

There are a number of ways to obtain the corresponding relationship between the voltage, current and temperature of the LED chip, a few of which are listed below. In general, when the LED chips are manufactured in the factory, the manufacturer will provide a chart for the corresponding relationship between the LED voltage, current and temperature, and according to the chart, it is possible to provide the controller with the corresponding relationship between the voltage, current and temperature of the LED chip. They can also be measured through the actual LED chip, and the corresponding relationship between the voltage, current and temperature of the LED chip can be obtained according to the actual measured values. In addition, the corresponding relationship can be calculated using a formula, for example, by referring to an article entitled High power light-emitting diode junction temperature determination from current-voltage characteristics written by A. Keppens, W R Ryckaert, G. Deconinck, and P. Hanselaer, published in October 2008 at JOURNAL OF APPLIED PHYSICS, which provided a description of the corresponding relationship between 'the voltage, current and temperature of the LED chip. At the same time, the several methods mentioned above can be combined to obtain the corresponding relationship between the voltage, current and temperature of the LED chip. In some embodiments, the corresponding relationship between the voltage, current and temperature value of the LED chip is as shown in FIG. 1.

The corresponding relationship between the temperature and the fan speed of the LED chip can be adjusted according to the differences between different LED chips and LED lamps, to obtain the corresponding relationship most suitable for the LED chip or the LED lamp.

In some embodiments, the method of measuring the voltage and current of the LED chip includes reading the measured voltage and measured current of the LED chip directly using a single chip or an integrated chip, or by reading the measured voltage of the LED chip using an amplifier, and measuring the current value as well as amplifying the signal.

Figure 2:
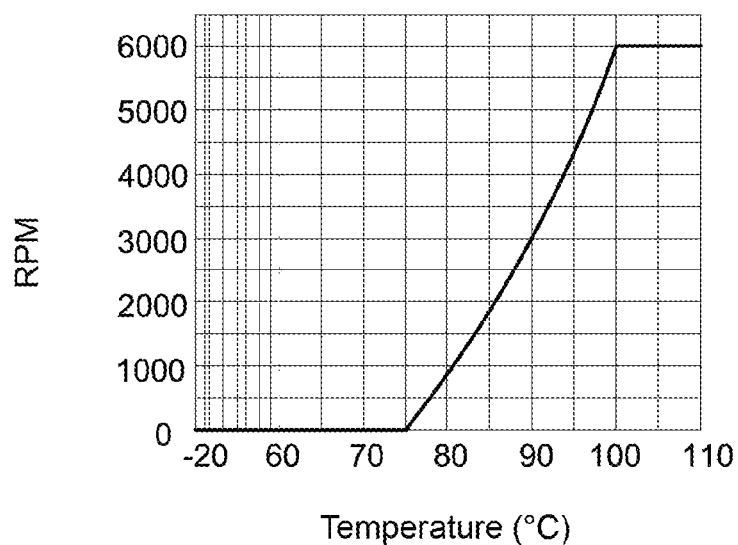
FIG. 2 is a preset corresponding relationship between the temperature and fan speed in continuous control mode.

In some embodiments, the steps for controlling the fan at the current desired speed include: controlling the fan to rotate at the current desired fan speed in continuous control mode through the controller. Wherein, the continuous control mode refers to the controller continuously reading the LED chip measured voltage and current, which are combined with the preset corresponding relationship between the voltage, current and temperature of the LED chip, subsequently determining the current desired fan speed based on the current calculated temperature and the preset corresponding relationship between the LED chip temperature and fan speed, and continuously controlling the fan to rotate at the current desired fan speed. In a specific embodiment, in the continuous control mode, the preset corresponding relationship between the LED chip temperature and fan speed is shown in FIG. 2, in which the different temperatures correspond to different fan speeds under different operating ranges; therefore the corresponding relationship is presented as a continuous curve or straight line in the figure according to different settings.

Figure 3:
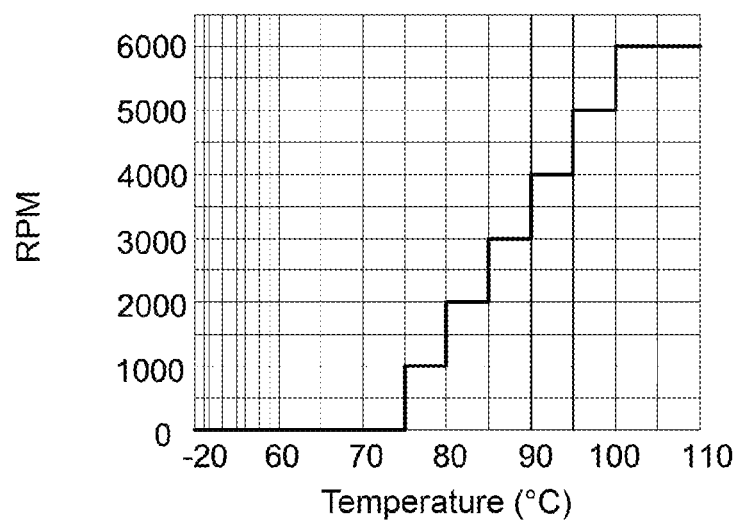
FIG. 3 is a preset corresponding relationship between the temperature and fan speed in stepwise control mode.

In another embodiments, the steps for rotating the control fan at the current desired speed include: controlling the fan to rotate at the current desired fan speed in a stepwise control mode through the controller. By having the controller read the LED chip measured voltage and current at each fixed period of time and combining with the LED chip current calculated temperature obtained through the preset corresponding relationship between the voltage, current and temperature of the LED chip, subsequently determining the temperature range of the current calculated temperature, and controlling the fan to rotate at the fan speed corresponding to the temperature range where the current calculated temperature is located. In a specific embodiment, in the stepwise control mode, the preset corresponding relationship between the LED chip temperature and the fan speed is shown in FIG. 3, in which all of the temperature values within any one temperature range correspond to the same fan speed; therefore the corresponding relationship is ladder-like in the figure.

In some embodiments where a stepwise control mode is used, a minimum preset calculated temperature value tmin, a maximum preset calculated temperature value tmax, a minimum temperature range Dmin composed of all temperature values lower than the minimum preset calculated temperature value, a maximum temperature range Dmax composed of all temperature values higher than the maximum preset calculated temperature value, one or more adjusted temperature ranges between the minimum preset calculated temperature value and the maximum preset calculated temperature value, as well as a corresponding fan speed preset on the controller corresponding to the minimum temperature range, maximum temperature range and adjusted temperature range, can be preset on the controller. Wherein, tmin can be selected according to models of LED lamps and LED chip, such as 70 degrees, 75 degrees or 80 degrees; tmax can also be selected according to models of LED lamps and LED chip, such as 100 degrees, 105 degrees or 110 degrees.

The temperature range of the current calculated temperature value T may be determined by the controller at each fixed interval of time. If the current calculated temperature value T is within the minimum temperature range, the fan will be turned off by the controller. If the currently calculated temperature value T is within the maximum temperature range, the fan will be controlled to rotate at the highest speed by the controller. The fan is controlled by the controller to allow the fan to rotate at a corresponding fan speed corresponding to the current temperature range, wherein the current calculated temperature value T is located, if the current calculated temperature value T is within the adjusted temperature range.

For convenience, here, tmin is 70 degrees and tmax is 110 degrees as an example, then Dmin is the range composed by all the temperature values less than 70 degrees, Dmax is the range composed by all the temperature values greater than 110 degrees. Using an example of an adjusted temperature range for every 10 degrees, 70 degrees to 80 degrees shall be the first adjusted temperature range D1, 80 degrees to 90 degrees shall be the second adjusted temperature range D2, 90 degrees to 100 degrees shall be the third adjusted temperature range D3, 100 degrees to 110 degrees shall be the fourth adjusted temperature range D4.

If a fan with maximum speed of 6,000 rpm is selected here, then the controller can be preset to the following corresponding relationship: tmin is corresponding to the fan speed of 0, that is, turning off the fan; tmax is corresponding to the fan speed of 6,000 rpm, i.e. the maximum speed of the fan; fan speeds corresponding to temperature ranges D1, D2, D3 and D4 are 1,200 rpm, 2,400 rpm, 3,600 rpm and 4,800 rpm, respectively.

For each fixed time interval, the temperature range of the current calculated temperature value T is determined by the controller and the fan is controlled to rotate at a corresponding rotational speed according to the temperature range. For example, if T is 68 degrees, the fan is turned off by the controller; if T is 83 degrees, then T is within the D2 adjusted range, the corresponding fan speed is 2,400 rpm, and the controller controls the fan to rotate at a rotational speed of 2,400 rpm; if T is 115 degrees, the fan is controlled to rotate at 6,000 rpm by the controller.

In some embodiments, the fixed time interval is within the range of 0.01 seconds to 10 seconds.

In some embodiments, different control mode may be used by the controller at different stages; for example, during the temperature rising stage, the fan is controlled by the controller in a continuous control mode to rotate at the current desired fan speed, while during the temperature lowering stage, the fan is controlled by the controller in a step-wise control mode to rotate at the current desired fan speed.

Another aspect of an embodiment of the present invention relates to a system for controlling the rotational speed of a fan in an LED lamp, the system comprising a voltage measuring unit, a current measuring unit and a controller.

The voltage measuring unit is used to measure the voltage of the LED chip in the LED lamp, the current measuring unit is used to measure the current of the LED chip, and the controller is used to control the rotational speed of the fan. The controller is connected to the voltage measuring unit and the current measuring unit.

In some embodiments, the voltage measurement unit, the current measurement unit, and the controller may be integrated into the microcontroller and the integrated chip. In some embodiments, the controller may be connected to an amplifier which is used to read the measured voltage and the measured current of the LED chip.

Wherein, the controller has a corresponding relationship between the voltage, current and temperature of the LED chip, and a corresponding relationship between the temperature and fan speed of the LED chip. Furthermore, the controller is configured to determine LED chip's current calculated temperature according to the voltage measured by the voltage measuring unit, the current measured by the current measuring unit, as well as the preset corresponding relationship between the voltage, current and temperature of the LED chip; to determine the current desired fan speed through the current calculated temperature and the corresponding relationship between the temperature and fan speed of the LED chip; as well as to control the fan to rotate at the current desired fan rotational speed. As previously described, the controller may be configured to control the fan to rotate at the current desired fan speed in the continuous control mode or stepwise control mode. The specific approach to the control mode has been described and explained in the previous paragraph, and will not be repeated here.

Embodiments of the present invention also relate to an LED lamp using the control method and system, the LED lamp comprising an LED chip, a fan for cooling the LED chip, and a system for controlling the rotational speed of the fan. Wherein, the LED chip is any LED light emitting unit.

Figure 4:
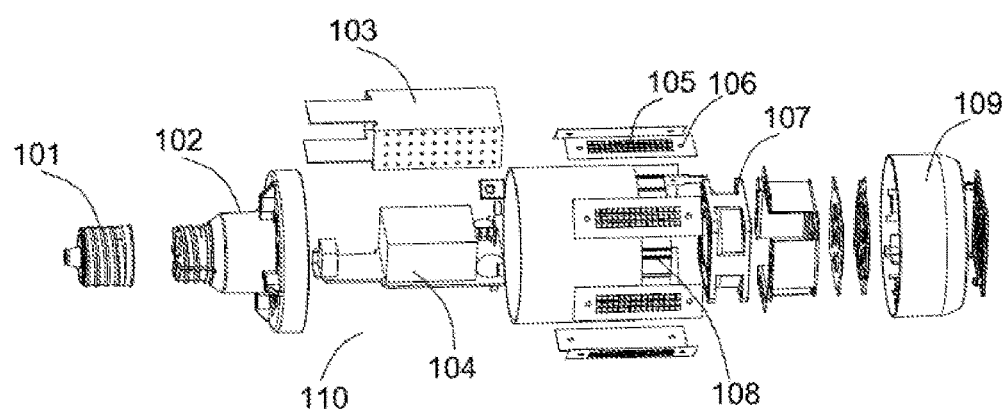
FIG. 4 is an exploded view of an LED lamp with a system for controlling the speed of a fan for cooling an LED chip in an LED lamp.

FIG. 4 is an exploded view of an assembly of an LED lamp 100 including a system for controlling the rotational speed of a fan, wherein the LED lamp 100 includes a lamp cap 101, an upper cover 102, a Mylar case 103, a drive device 104 including a controller, an LED light source board 106 composed of an LED chip 105, a fan 107, a heat sink 108, a bottom cover 109, and a control system 110 for controlling the rotational speed of the fan 107.

Wherein, the Mylar case 103 is used to insulate the drive device 104 including the controller from the heat sink 108, which is used to cool the LED chip 105, and the heat sink 108 is used to increase the heat dissipation area of the LED light source board 105. The drive device 104 including the controller is integrated with a controller, a driver, a voltage measuring unit and a current measuring unit.

The lamp cap 101 is connected to the upper cover 102 by a thread, the drive including the controller is fixed to the upper cover 102 by glue, the heat sink 108 is connected to the upper cover 102 by screws, while the fan 107, the light source plate 105, the bottom cover 109 are fixed to the heat sink 108 by screws.

The corresponding relationship between the voltage, current and temperature of the LED chip 105 and the corresponding relationship between the temperature of the LED chip 105 and the rotational speed of the fan 107 are preset in the driving device 104. The drive device 104 including the controller may be configured to determine the current calculated temperature according to the current measured by the current measurement unit, the voltage measured by the voltage measurement unit and the preset corresponding relationship between the voltage, current and temperature of the LED chip 105; and determine the current desired rotational speed of the fan 107 and control the fan 107 to rotate at the current desired fan 107 speed according to the current calculated temperature and the corresponding relationship between the temperature of the LED chip 105 and the speed of the fan 107. The specific control method may be the same as or similar to that described above, and will not be described again.

This specification describes the present invention by referring to specific embodiments, including the best mode, and may assist any person skilled in the art of the present invention in performing experimental operations. These operations include the use of any system and the use of any specific method. The scope of the present invention is defined by the claims and may include other examples that occur in the art. If the other examples are structurally different from the written language of the claims, or that they have a comparable structure as described in the claims, they are considered to be within the scope of the claims of the present invention.

The invention claimed is:

1. A method for controlling a rotate speed of a fan for a LED lamp, comprising:
   presetting in a controller a corresponding relationship among voltage, current and temperature of a LED chip of the LED lamp;
   presetting in the controller a corresponding relationship between temperature of the LED chip and rotate speed of the fan;
   measuring a voltage value of the LED chip;
   measuring a current value of the LED chip;
   determining a calculated temperature value of the LED chip based on the measured voltage value, the measured current value and the corresponding relationship among voltage, current and temperature of the LED chip, by the controller;
   determining a needed rotate speed value of the fan based on the calculated temperature value and the corresponding relationship between temperature of the LED chip and rotate speed of the fan, by the controller; and
   controlling the fan to rotate at the needed rotate speed value, by the controller.

2. The method according to claim 1, wherein the fan is controlled by the controller to rotate at the needed rotate speed value in a continuous control mode.

3. The method according to claim 1, wherein the fan is controlled by the controller to rotate at the needed rotate speed value in a step-by-step control mode.

4. The method according to claim 3, further comprising:
   presetting in the controller a minimum preset value of the calculated temperature, a maximum preset value of the calculated temperature, a minimum temperature range comprising temperature values smaller than the minimum preset value, a maximum temperature range comprising temperature values greater than the maximum preset value, and one or more speed control temperature ranges between the minimum preset value and the maximum preset value;
   presetting corresponding fan rotate speeds corresponding to the minimum temperature range, the maximum temperature range and the one or more speed control temperature ranges respectively, in the controller;
   determining the temperature range which the calculated temperature value is in, at set intervals, by the controller;
   shutting down the fan by the controller, when the calculated temperature value is in the minimum temperature range;
   controlling the fan to rotate at the highest rotate speed by the controller, when the calculated temperature value is in the maximum temperature range; and
   controlling the fan to rotate at the rotate speed corresponding to the temperature range which the calculated temperature value is in, by the controller, when the calculated temperature value is in one of the one or more speed control temperature ranges.

5. The method according to claim 4, wherein the set interval is in a range from 0.01 second to 10 seconds.

6. A system for controlling a rotate speed of a fan for cooling a LED chip of a LED lamp, comprising:
   a voltage measurement unit for measuring a voltage value of the LED chip;
   a current measurement unit for measuring a current value of the LED chip;
   a controller coupled with the voltage measurement unit and the current measurement unit, for controlling the rotate speed of the fan, wherein:
   the controller is preset with a corresponding relationship among voltage, current and temperature of the LED chip, and a corresponding relationship between temperature of the LED chip and rotate speed of the fan, and
   the controller is configured to determine a calculated temperature value of the LED chip based on the voltage value measured by the voltage measurement unit, the current value measured by the current measurement unit and the corresponding relationship among voltage, current and temperature of the LED chip, to determine a needed rotate speed value of the fan based on the calculated temperature value and the corresponding relationship between temperature of the LED chip and rotate speed of the fan, and to control the fan to rotate at the needed rotate speed value.

7. The system according to claim 6, wherein the controller is configured to control the fan to rotate at the needed rotate speed value in a continuous control mode.

8. The system according to claim 6, wherein the controller is configured to control the fan to rotate at the needed rotate speed value in a step-by-step control mode.

9. The system according to claim 8, wherein
the controller is preset with a minimum preset value of the calculated temperature, a maximum preset value of the calculated temperature, a minimum temperature range comprising temperature values smaller than the minimum preset value, a maximum temperature range comprising temperature values greater than the maximum preset value, and one or more speed control temperature ranges between the minimum preset value and the maximum preset value;
the controller is preset with corresponding fan rotate speeds corresponding to the minimum temperature range, the maximum temperature range and the one or more speed control temperature ranges respectively;
the controller is configured to:
determine which temperature range of the calculated temperature value is in at set intervals;
shut down the fan, when the current calculated temperature value is in the minimum temperature range;
control the fan to rotate at the highest rotate speed, when the current calculated temperature value is in the maximum temperature range; and
control the fan to rotate at the rotate speed corresponding to the temperature range which the calculated temperature value is in, when the current calculated temperature value is in one of the one or more speed control temperature ranges.

10. The system according to claim 9, wherein the set interval is in a range from 0.01 second to 10 seconds.

11. A LED lamp, comprising:
a LED chip;
a fan for cooling the LED chip of the LED lamp; and
a system for controlling a rotate speed of the fan, the system comprising:
a voltage measurement unit for measuring a voltage value of the LED chip;
a current measurement unit for measuring a current value of the LED chip;
a controller coupled with the voltage measurement unit and the current measurement unit, for controlling the rotate speed of the fan, wherein:
the controller is preset with a corresponding relationship among voltage, current and temperature of the LED chip, and a corresponding relationship between temperature of the LED chip and rotate speed of the fan, and
the controller is configured to determine a calculated temperature value of the LED chip based on the voltage value measured by the voltage measurement unit, the current value measured by the current measurement unit and the corresponding relationship among voltage, current and temperature of the LED chip, to determine a needed rotate speed value of the fan based on the calculated temperature value and the corresponding relationship between temperature of the LED chip and rotate speed of the fan, and to control the fan to rotate at the needed rotate speed value.

* * * * *